United States Patent
Ishikawa et al.

(10) Patent No.: US 6,639,358 B2
(45) Date of Patent: Oct. 28, 2003

(54) ORGANIC ELECTROLUMINESCENT DEVICE WITH BURIED LOWER ELECRODES AND METHOD FOR MANUFACTURING THE SAME

(75) Inventors: Hitoshi Ishikawa, Tokyo (JP); Etsuo Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/073,908

(22) Filed: Feb. 14, 2002

(65) Prior Publication Data

US 2002/0113547 A1 Aug. 22, 2002

(30) Foreign Application Priority Data

Feb. 15, 2001 (JP) .................................. 2001-038813

(51) Int. Cl.[7] .................................................. H01J 1/62
(52) U.S. Cl. .......................... 313/504; 313/506; 313/505
(58) Field of Search ................................. 313/498, 504, 313/505, 506, 509, 512, 495

(56) References Cited

U.S. PATENT DOCUMENTS 5,491,376 A * 2/1996 Levine et al. ............... 313/495
5,714,841 A * 2/1998 Miyazaki .................... 313/585

FOREIGN PATENT DOCUMENTS

| JP | 7-138561 | 5/1995 |
|---|---|---|
| JP | 8-20771 | 1/1996 |
| JP | 8-40995 | 2/1996 |
| JP | 8-40997 | 2/1996 |
| JP | 8-053397 | 2/1996 |
| JP | 8-87122 | 4/1996 |
| JP | 8-239655 | 9/1996 |
| JP | 11-74079 | 3/1999 |
| JP | 11-185961 | 7/1999 |

OTHER PUBLICATIONS

C.W. Tang et al., "Organic Electroluminescent Diodes", Appl. Phys. Letter, 51 (12), Sep. 21, 1987, pp. 913–915.

* cited by examiner

Primary Examiner—Vip Patel
(74) Attorney, Agent, or Firm—Sughrue Mion, PLLC

(57) ABSTRACT

In an organic electroluminescent device, a plurality of striped grooves are formed on an insulating substrate along a first direction. A plurality of lower electrodes are substantially buried in the striped grooves. Organic layers are formed on the insulating substrate and the lower electrodes. A plurality of striped upper electrodes are formed on the organic layers along a second direction different from the first direction.

19 Claims, 12 Drawing Sheets

ORGANIC ELECTROLUMINESCENT DEVICE WITH BURIED LOWER ELECRODES AND METHOD FOR MANUFACTURING THE SAME

BACKGROUND OF THE INVENTION

1. Field of the Invention

The present invention relates to an organic electroluminescent device and its manufacturing method.

2. Description of the Related Art

Organic electroluminescent devices have been developed ever since C. W. Tang et al. published "Organic Electroluminescent Diodes", Applied Physics Lett. 51(12), pp. 913–915, Sep. 21, 1987.

Tang et al. reported an electroluminecent device of a stacked structure using tris (8-quinolinol aluminum) in an emitting layer and a triphenyldiamine derivative in a hole-transporting layer. This stacked structure has advantages in that the injection efficiency of holes into the emitting layer can be improved, that electrons injected from a cathode can be blocked to increase the efficiency of exciton production from charge recombination, and that the excitons into the emitting layer can be confined. A multi-layered structure such as a double layered structure composed of a hole-injecting and transporting layer and an electron-transporting and emitting layer or a triple layered structure composed of a hole-injecting and transporting layer, an emitting layer and an electron-injecting and transporting layer is well known as an organic electroluminescent device. In order to increase the recombination efficiency of injected holes and electrons, various improvements have been introduced into the structure and fabrication process of the multi-layered structure.

In the above-described prior art organic electroluminescent device, however, since there are steps at the edges of the lower electrodes (anode), the portions of the organic layers such as the hole-transporting layer, the emitting layer and the electron-transporting layer in proximity to the steps of the lower electrodes become thinner. Particularly, when the organic layers whose thickness is usually about 100 nm becomes thinner in the proximity of the steps of the lower electrodes, a short-circuit would occur between the lower electrodes and the upper electrodes (cathodes) through the thinner portions of the organic layers, to damage the organic electroluminescent device. Additionally, since the organic electroluminescent device is subject to wettability by water, the brightness and life-time characteristics would be deteriorated by the thinner organic layers.

SUMMARY OF THE INVENTION

It is an object of the present invention to provide an organic electroluminescent device capable of suppressing the thinner portions of the organic layers.

Another object is to provide a method for manufacturing the above-mentioned organic electroluminescent device.

According to the present invention, in an organic electroluminescent device, a plurality of striped grooves are formed on an insulating substrate along a first direction. A plurality of lower electrodes are substantially buried in the striped grooves. An organic layers are formed on the insulating substrate and the lower electrodes. A plurality of striped upper electrodes are formed on the organic layers along a second direction different from the first direction.

Also, in a method for manufacturing an organic electroluminescent device, a plurality of striped grooves are formed in an insulating substrate along a first direction. Then, a photoresist pattern layer is formed have elements each formed on protrusions of the insulating substrate sandwiched by the grooves of the insulating substrate. Then, a conductive layer made of indium tin oxide (ITO), for example, is deposited on the photoresist pattern layer and in the grooves of the insulating substrate by a sputtering process. Then, a lift-off operation is performed upon the photoresist pattern layer to remove the photoresist pattern layer and a first part of the conductive layer on the photoresist pattern layer, thereby leaving a second part of the conductive layer buried in the grooves of the insulating substrate as lower electrodes. Then, an organic layers are formed on the insulating substrate and the lower electrodes. Finally, a plurality of striped upper electrodes are formed on the organic layers along a second direction different from the first direction.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, a prior art method for manufacturing an organic electroluminescent device will be explained with reference to FIGS. 1A, 1B, 1C and 1D.

Figure 1A:
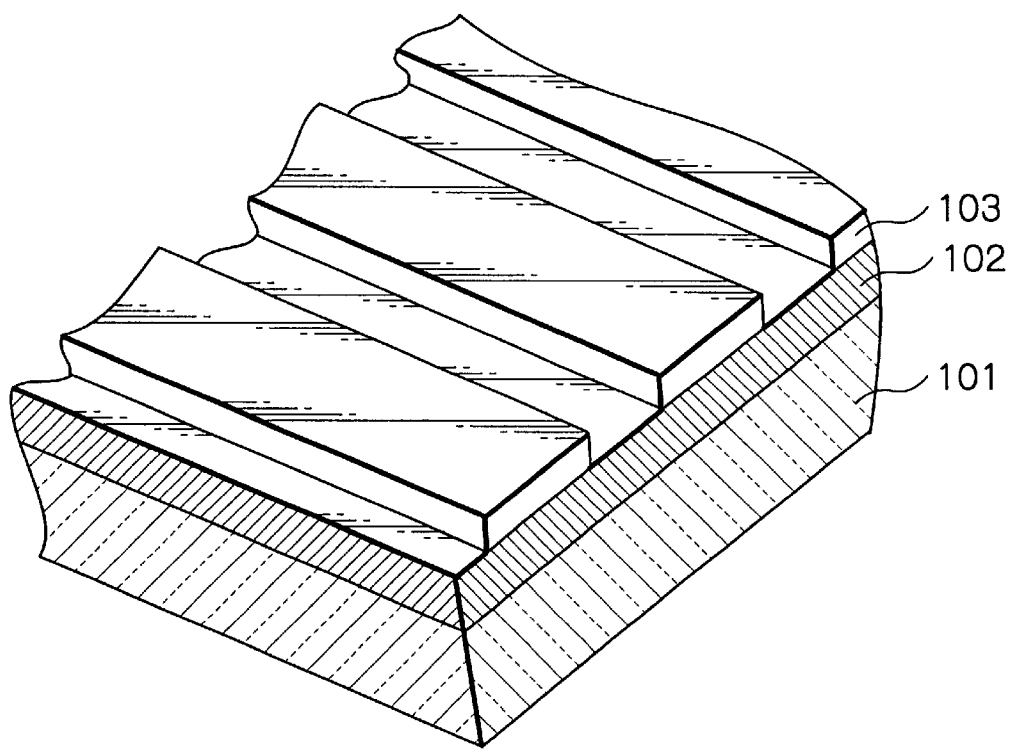
FIGS. 1A, 1B, 1C and 1D are perspective views for explaining a prior art method for manufacturing an organic electroluminescent device.

First, referring to FIG. 1A, an indium tin oxide (ITO) layer 102 is deposited by a magnetron sputtering process on a transparent insulating substrate 101 made of glass. Then, a photoresist pattern layer 103 is formed by a photolithography process.

Figure 1B:
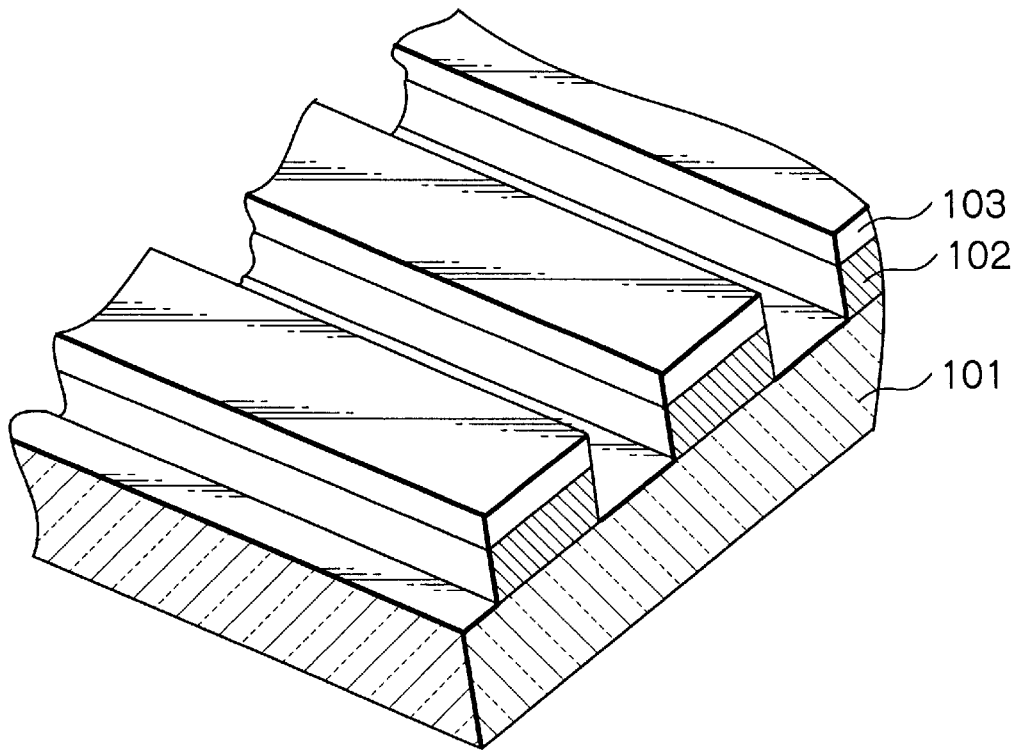

Next, referring to FIG. 1B, the ITO layer 102 is patterned by an etching process using the photoresist pattern layer 103 as a mask, to form striped lower electrodes.

Figure 1C:
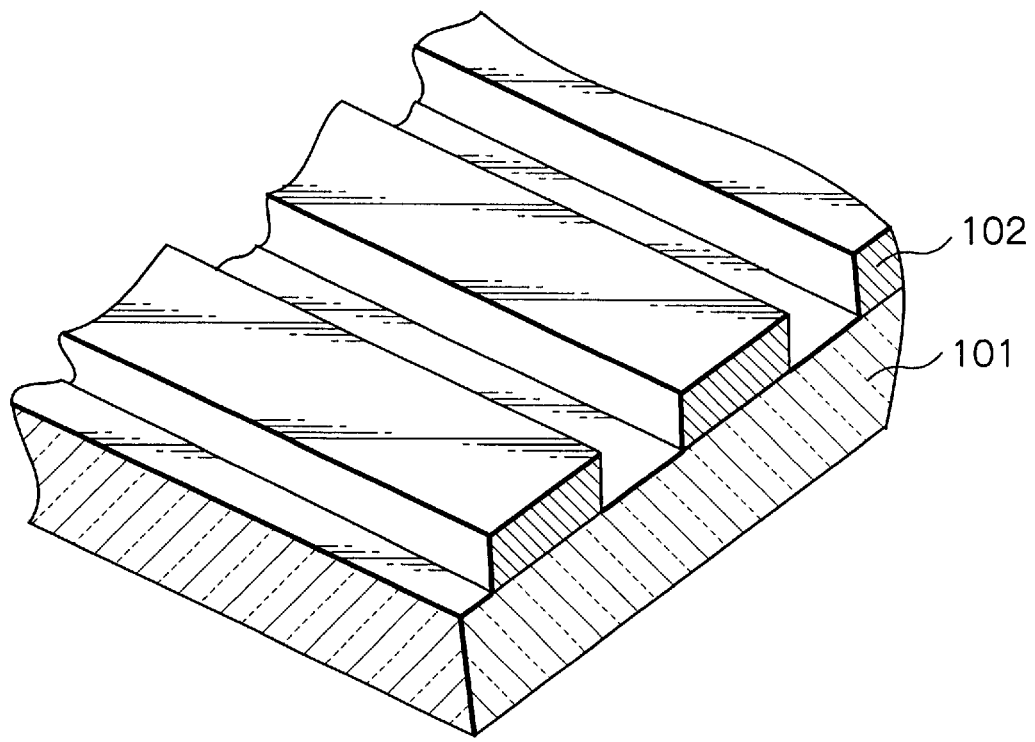

Next, referring to FIG. 1C, the photoresist pattern layer 103 is removed.

Figure 1D:
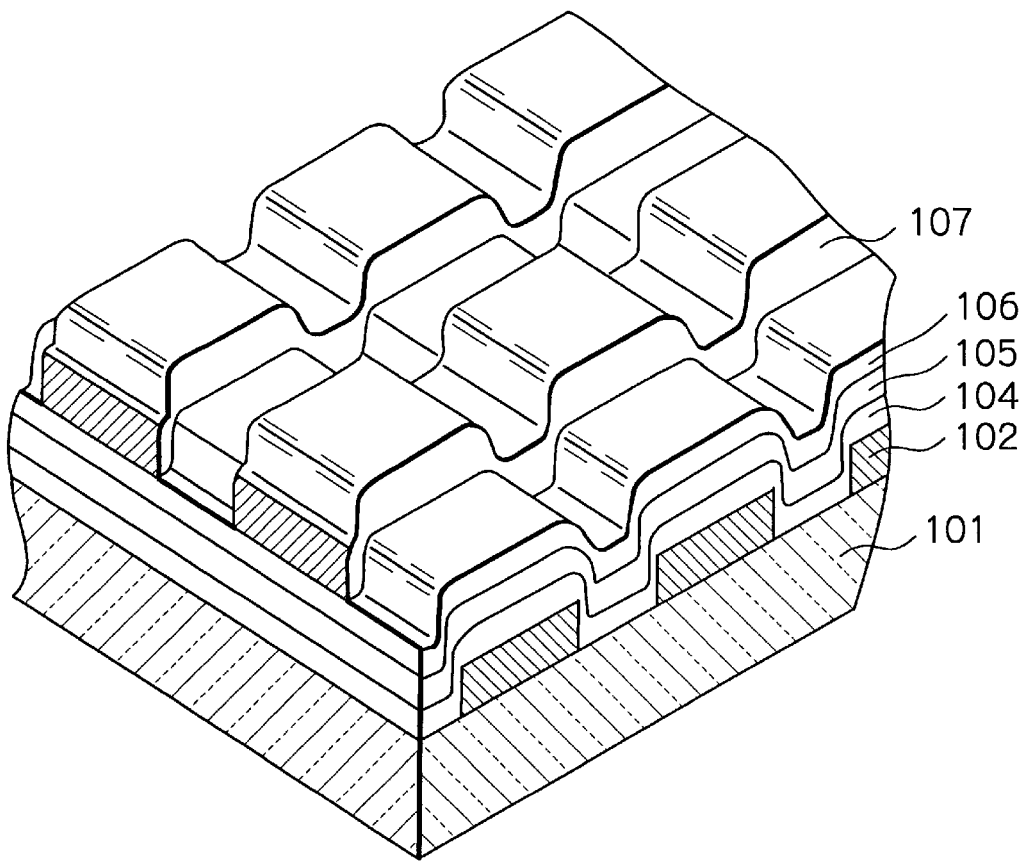

Finally, referring to FIG. 1D, a hole-transporting layer 104, an emitting layer 105 and an electron-transporting layer 106 are sequentially deposited by a vacuum evaporation process. Then, a plurality of striped upper electrodes 107 made of Mg—Ag alloy are formed by a vacuum co-evaporation process using a metal mask. In this case, the upper electrodes 107 are normal to the lower electrodes 102. Then, the upper electrodes 107 are sealed by resin, to complete the organic electroluminescent device.

In the above-described prior art method as illustrated in FIGS. 1A, 1B, 1C and 1D, however, since there are steps at the edges of the lower electrodes 102, the portions of the hole-transporting layer 104, the emitting layer 105, the electron-transporting layer 106 and the upper electrodes 107 in proximity to the steps of the lower electrodes 102 become thinner. Particularly, when the emitting layer 105 becomes thinner, a short-circuit would occur between the lower electrodes 102 and the upper electrodes 107 through the thinner portions of the organic layer, to damage the organic electroluminescent device. Additionally, since the organic electroluminescent device is subject to wettability by water, the brightness and life-time characteristics would be deteriorated by the thin organic layers 105.

Note that, although it is possible to increase the thickness of the thin organic layers in proximity to the steps of the lower electrodes 102 by increasing the entirety of the organic layers, the organic Layers are actually very thin, i.e., about 100 nm at most in view of effectively operating the organic electroluminescent device. Therefore, it is actually impossible to increase the thickness of the entirety of the organic layers.

An embodiment of the method for manufacturing an organic electroluminescent device according to the present invention will be explained next with reference to FIGS. 2A, 2B, 2C, 2D, 2E, 2F, 2G, 3a and 3B.

Figure 2A:
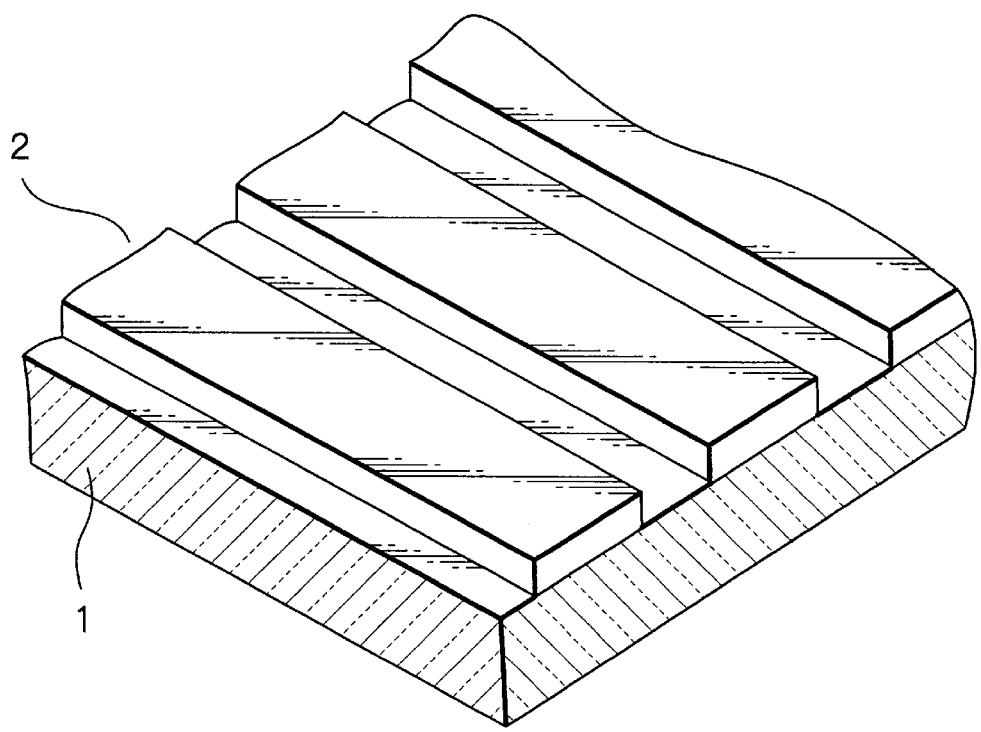
FIGS. 2A, 2B, 2C, 2D, 2E, 2F and 2G are perspective views for explaining an embodiment of the method for manufacturing an organic electroluminescent device according to the present invention.

First, referring to FIG. 2A, a striped positive type photoresist pattern layer 2 is formed by a photolithography process on a transparent insulating substrate 1 made of glass. In this case, the stripes of the photoresist pattern layer 2 are aligned along a predetermined direction.

Figure 2B:
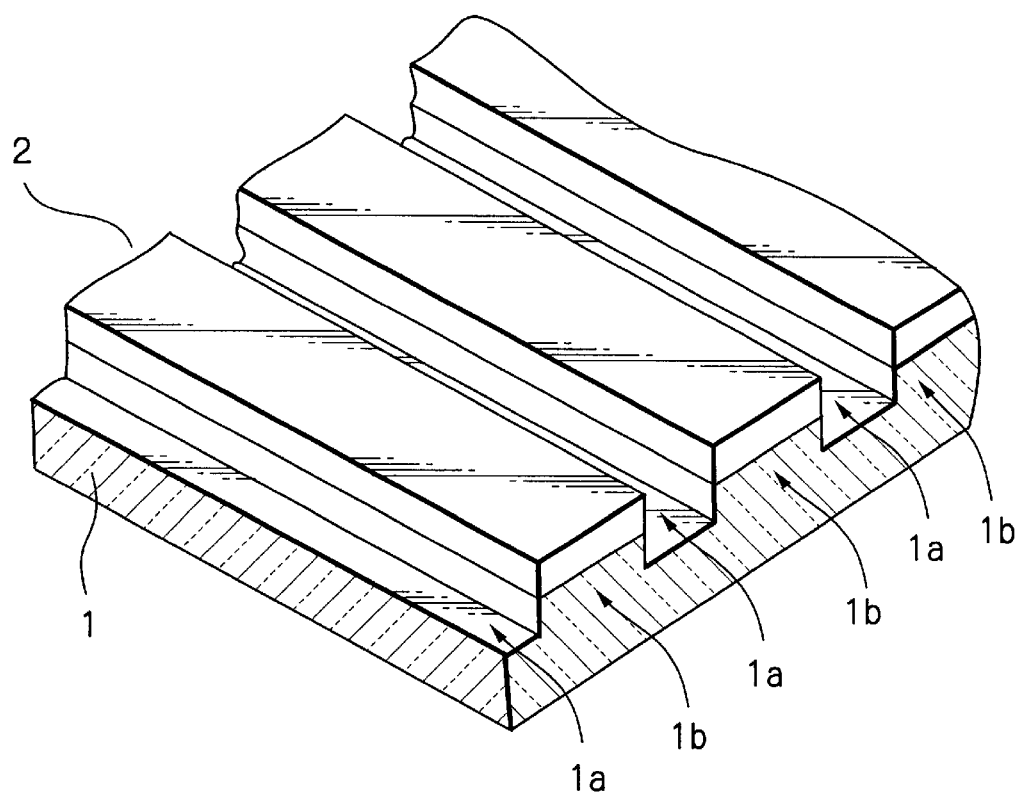

Next, referring to FIG. 2B, the transparent insulating substrate 1 is etched by a reactive ion etching (RIE) process using $CF_4$ gas or $CF_4/H_2$ mixture gas. As a result, a plurality of about 50 μm-wide and 50 nm-deep grooves 1a and a plurality of protrusions 1b are alternately formed on the transparent insulating substrate 1. Then, the photoresist pattern layer 2 is removed.

Figure 2C:
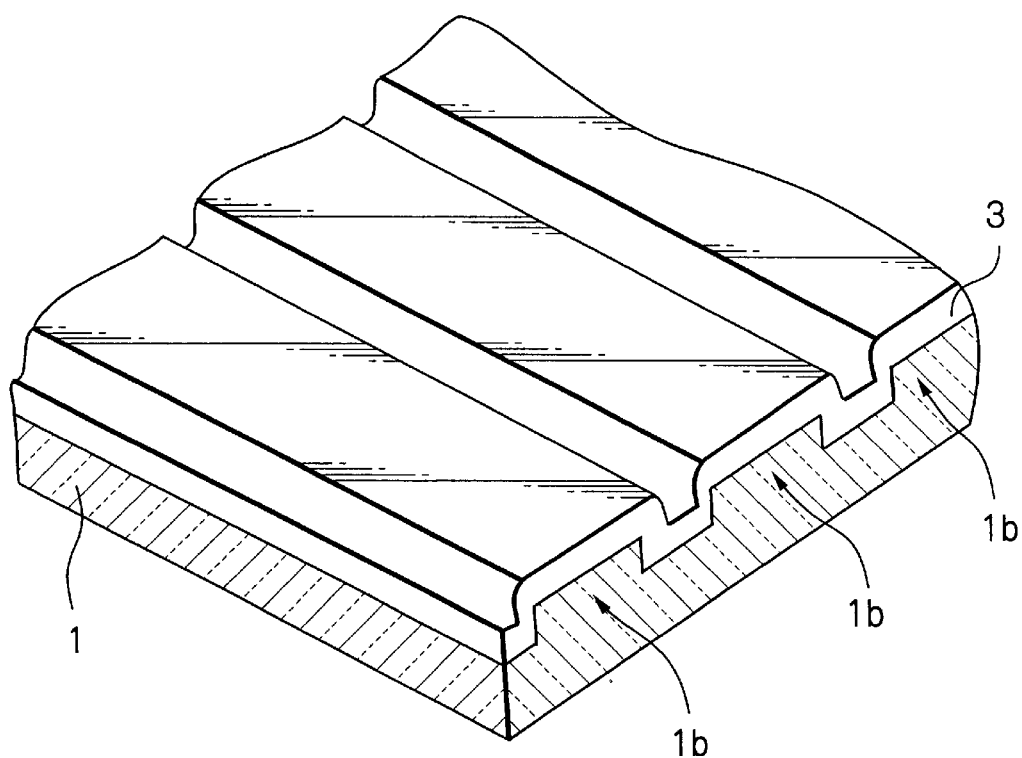

Next, referring to FIG. 2C, a negative type photoresist layer 3 is coated on the transparent insulating substrate 1 by a spin-coating process.

Figure 2D:
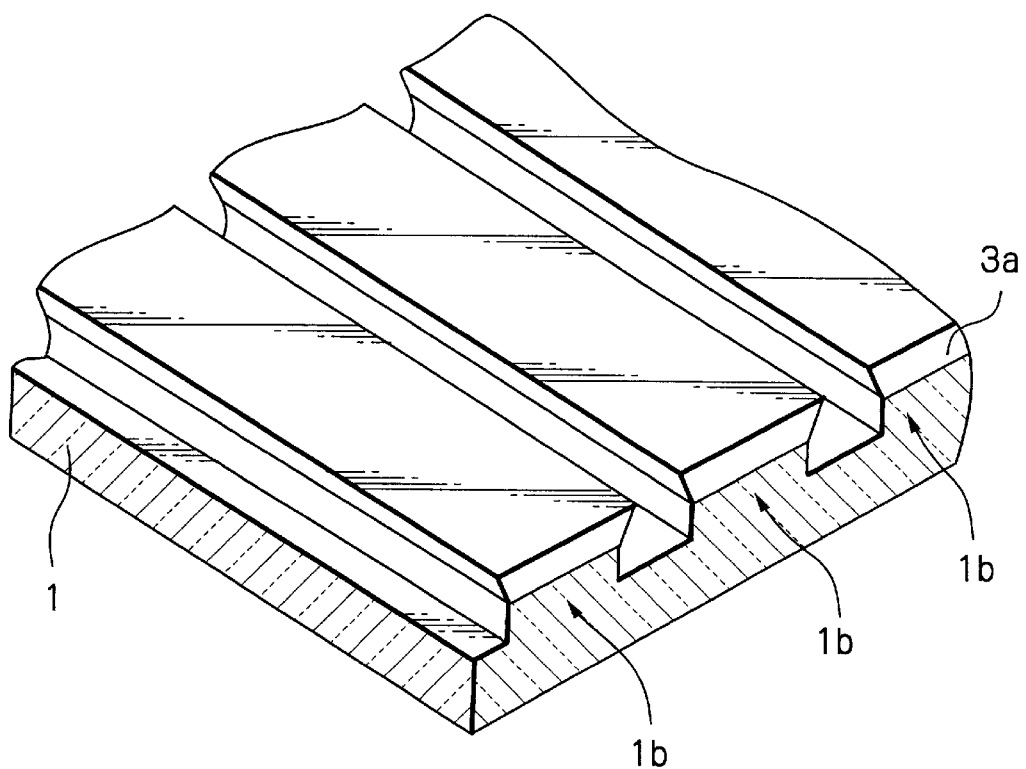
Figure 3A:
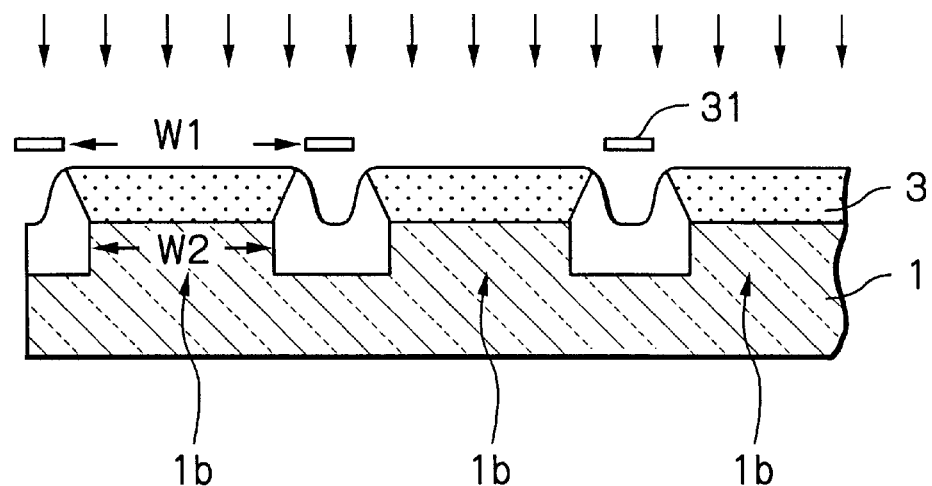
FIGS. 3A and 3B are cross-sectional views for explaining the step of FIG. 2C in detail.
Figure 3B:
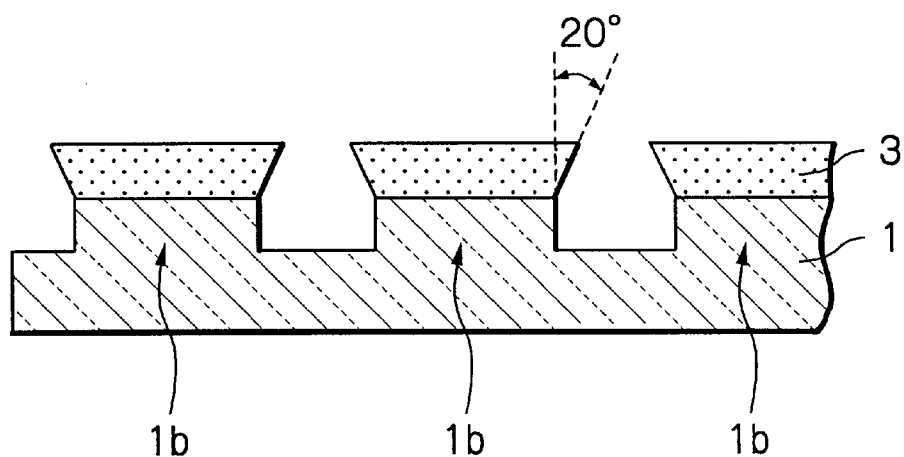

Next, referring to FIG. 2D, the photoresist layer 3 is patterned by a photolithography process, so that a photoresist pattern layer 3a having reversely-tapered cross-section is formed. In more detail, as illustrated in FIG. 3A, a photomask 31 is placed on the photoresist layer 3, and the photoresist layer 3 is irradiated with ultraviolet rays through the photomask whose opening width W1 is larger than the width W2 of the protrusions 1b of the transparent insulating substrate 1. In this case, the lower the portion of the photoresist layer 3, the smaller the exposure amount of ultraviolet rays. Therefore, as illustrated in FIG. 3B, when a developing process is performed upon the photoresist layer 3, a difference is generated in the developing speed of the photoresist layer 3, so that the photoresist pattern layer 3a has a reversely-tapered cross-section whose angle is about 20°. Note that the width W1 of the photomask 31, the alignment of the photomask 31 to the transparent insulating substrate 1, and the exposure amount of ultraviolet rays and the developing speed can be adjusted so that each lower side of the photoresist pattern layer 3a coincides with each of the protrusions 1b of the transparent insulating substrate 1.

Figure 2E:
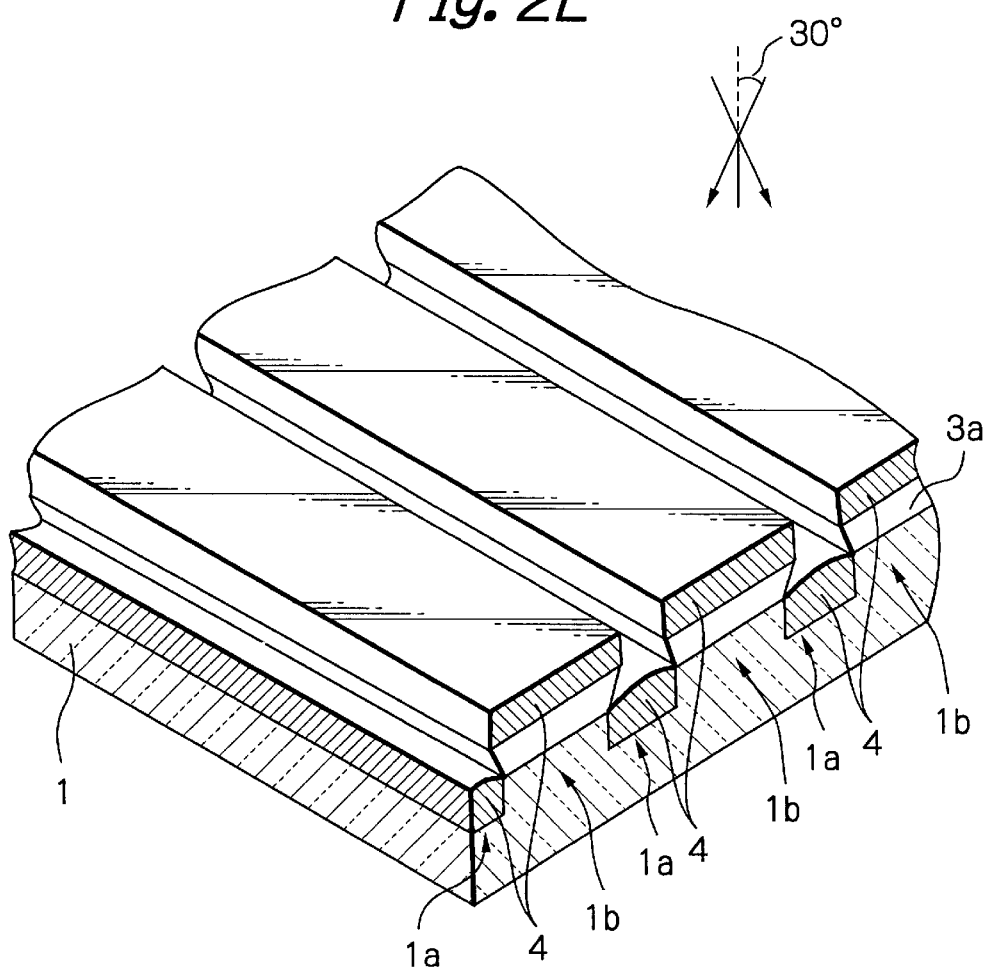

Next, referring to FIG. 2E, an ITO layer 106 is deposited by a magnetron sputtering process on the photoresist pattern layer 3a and in the grooves 3. In this case, the transparent insulating substrate 1 is rotated while the principal plane thereof is inclined at an angle of about 30° with respect to the plane of a target (not shown). As a result, the ITO layer 4 is completely buried in the grooves 1a of the transparent insulating substrate 1. Also, since the sidewalls of the photoresist pattern layer 3a are reversely-tapered, the ITO layer 4 is hardly deposited on the sidewalls of the photoresist pattern layer 3a.

Figure 2F:
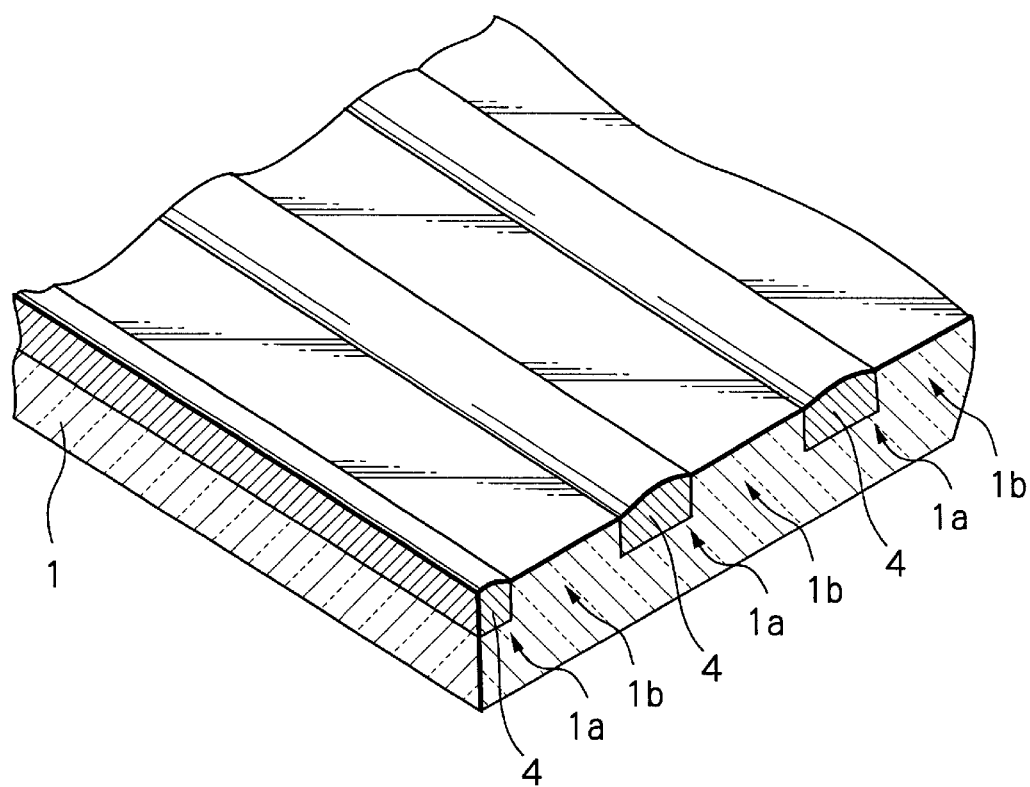

Next, referring to FIG. 2F, a so-called lift-off operation is performed upon the photoresist pattern layer 3a, so that the photoresist pattern layer 3a and the ITO layer 4 thereon are simultaneously removed. Thus, lower electrodes are formed by the ITO layer 4 buried in the grooves 1a of the transparent insulating substrate 1. In this case, since the ITO layer 4 is formed by the rotation of the transparent insulating substrate 1 while the transparent insulating substrate 1 is inclined, the surface of the lower electrodes formed by the ITO layer 4 is convex. Therefore, as occasion demands, a flattening process such as a chemical mechanical polishing (CMP) process can be performed upon the convex lower electrodes.

Figure 2G:
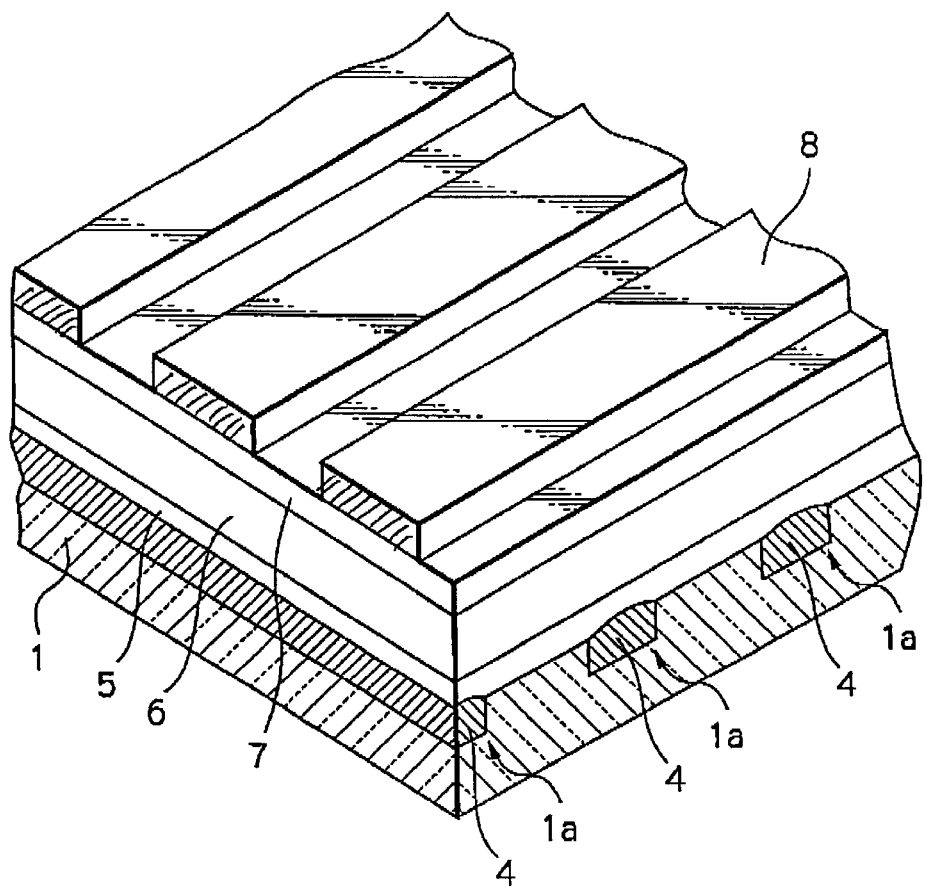

Finally, referring to FIG. 2G, an about 50 nm thick hole-transporting layer 5, an about 40 nm emitting layer 6 and an about 20 nm thick electron-transporting layer 7 are sequentially deposited by a vacuum evaporation process. Then, a plurality of about 200 nm thick and about 10 μm wide striped upper electrodes 8 made of Mg—Ag alloy are formed by a vacuum co-evaporation process. In this case, the upper electrodes 8 are normal to the lower electrodes formed by the ITO layer 4. Then, the upper electrodes 8 are sealed by resin, to complete the organic electroluminescent device.

According to the inventors' experiment, the organic electroluminescent device of FIG. 2G was driven to generate high blue brightness of 10,000 $cd/m^2$ with a DC voltage of 10V applied thereto. Additionally, under a continuous DC voltage operation mode, the blue brightness did not decay to about half of the initial blue brightness of 1,000 $cd/cm^2$ at the end of 30,000 hours. On the other hand, in the prior art organic electroluminescent device of FIG. 1D, under a continuous DC voltage operation mode, the blue brightness decayed to about half of the initial blue brightness of 1,000 $cd/cm^2$ at the end of 10,000 hours.

In the above-described embodiment, the hole-transporting layer 5, the emitting layer 6 and the electron-transporting layer 7 are sandwiched by the lower electrodes 4 and the upper electrodes 8. However, the hole-transporting layer 5 and/or the electron-transporting layer 7 can be omitted.

Also, the lower electrodes are made of ITO. However, the lower electrodes can be made of other materials having a work function of larger than 4.5 eV depending upon the material of the emitting layer 6 to inject holes into the emitting layer 6 (or the hole-transporting layer 5). For example, metal oxide such as IZO(IDIXO) or tin oxide (NESA), Au, Ag, Pt or Cu can be used.

As material for the hole-transporting layer 5, triphenylamine derivatives and aromatic diarylamine derivatives such 4,4',4"-tris(3-methylphenylamino)triphenylamine and N, N'-diphenyl-N, N'-bis(3-methylphenyl)-[1,1'-biphenyl]-4,4'-diamine which are star burst type compounds are well known (see: JP-A-8-20771, JP-A-8-40995, JP-A-8-40997, JP-A-8-53397 & JP-A-8-87122).

As material for the emitting layer 6, a chelate complex such as a tris(8-quinolinolate)aluminum complex, a coumarin derivative, a tetraphenybutadiene derivative, a bis-styrylarylene derivative, an oxadiazole derivative and diphenylaminoarylene are well known (see: JP-A-8-239655,JP-A-7-138561, JP-A-3-200889, JP-A-11-74079 & JP-A-11-185961).

The electron-transporting layer 7 is made of an oxadiazole derivative, a triazole derivative or a quinolinol metal complex.

The upper electrodes 8 are preferably made of conductive material having a small work function to inject electrons into the emitting layer 6 (or the electron-transporting layer 7). For example, the upper electrodes 8 are made of In, Al, Mg, Mg—In alloy, Mg—Al alloy, Al—Li alloy, Al—Sc—Li alloy or Mg—Ag alloy. Note that, since the lower electrodes which, in this case, serve as anodes are transparent, the upper electrodes 8 serving as cathodes are preferably made of conductive material having a high reflectivity to reflect light emitted from the emitting layer 6.

In the above-described embodiment, the grooves 1a are formed by a photolithography and RIE process using halogen gas as illustrated in FIG. 2B; however, a sandblast process can be used to blow sand against the transparent insulating substrate 1 covered by the photoresist pattern layer 2 which is then removed.

Also, the ITO layer 4 (the lower electrodes) is formed by a magnetron sputtering process; however, the ITO layer 4 can be formed by a vacuum evaporation process, an ion-plating process, a chemical vapor deposition (CVD) process, a sol-gel coating process, a spray process or a spin-coating process.

Further, the organic layers such as the hole-transporting layer 5, the emitting layer 6 and the electron-transporting layer 7 are formed by a vacuum evaporation process; however, the organic layers can be formed by a molecular beam epitaxial (MBE) process, a dipping process using solution including emitting material, or a coating process such as a spin-coating process, a casting process, a bar-coating process or a roll-coating process. In this case, the thickness of the organic layers can be optimized. That is, the thinner each of the organic layers, the larger the number of defects such as pinholes. On the other hand, the thicker each of the organic layers, the higher the voltage applied thereto for injecting carriers. In view of this, the thickness of each of the organic layers is preferably several nm to 1 $\mu$m.

Additionally, the upper electrodes 8 are formed by a vacuum evaporation process; however, the upper electrodes 8 can be formed by a magnetron sputtering process, an ion-plating process, a CVD process, a sol-gel coating process, a spray process or a spin-coating process.

As explained hereinabove, according to the present invention, since the lower electrodes are buried in the grooves of the insulating substrate, the thinner portions of the emitting layer and the other organic layers are suppressed, thus suppressing a short-circuit between the lower electrodes and the upper electrodes and improving the brightness and life-time characteristics of the organic electroluminescent device.

What is claimed is:

1. An organic electroluminescent device comprising:
    an insulating substrate where a plurality of striped grooves are formed along a first direction;
    a plurality of lower electrodes each substantially buried in one of said striped grooves;
    an emitting layer formed on said insulating substrate and said lower electrodes; and
    a plurality of striped upper electrodes formed on said emitting layer along a second direction different from said first direction.

2. The organic electrominescent device as set forth in claim 1, wherein said lower electrodes are anodes and said upper electrodes are cathodes.

3. The organic electroluminescent device as set forth in claim 2, further comprising a hole-transporting layer between said lower electrodes and said emitting layer.

4. The organic electroluminescent device as set forth in claim 2, further comprising an electron-transporting layer between said emitting layer and said upper electrodes.

5. The organic electroluminescent device as set forth in claim 1, wherein said insulating substrate is transparent and said lower electrodes comprise transparent conductive layers.

6. The organic electroluminescent device as set forth in claim 5, wherein said insulating substrate is transparent and said transparent conductive layers comprise indium tin oxide.

7. The organic electroluminescent device as set forth in claim 1, wherein said first direction is approximately normal to said second direction.

8. A method for manufacturing an organic electroluminescent device, comprising the steps of:
    forming a plurality of striped grooves in an insulating substrate along a first direction;
    forming a photoresist pattern layer having elements each formed on protrusions of said insulating substrate sandwiched by said grooves of said insulating substrate;
    depositing a conductive layer on said photoresist pattern layer and in said grooves of said insulating substrate by a sputtering process;
    performing a lift-off operation upon said photoresist pattern layer to remove said photoresist pattern layer and a first part of said conductive layer on said photoresist pattern layer, thereby leaving a second part of said conductive layer buried in said grooves of said insulating substrate as lower electrodes;
    forming an emitting layer on said insulating substrate and said lower electrodes; and
    forming a plurality of striped upper electrodes on said emitting layer along a second direction different from said first direction.

9. The method as set forth in claim 8, wherein each of said elements formed by said photoresist pattern layer forming step has a reversely-tapered cross section.

10. The method as set forth in claim 9, wherein said photoresist pattern layer forming step comprises the steps of:
    forming a negative type photoresist layer on said grooves and said protrusions of said insulating substrate;
    irradiating said negative type photoresist layer with ultraviolet rays using a mask covering said grooves of said insulating substrate; and
    removing a part of said negative type photoresist layer not exposing said ultraviolet rays to from said photoresist pattern layer.

11. The method as set forth in claim 8, wherein each of said elements formed said photoresist pattern layer forming step has a lower surface corresponding to one of said protrusions of said insulating substrate.

12. The method as set forth in claim 8, wherein said conductive layer depositing step forms said conductive layer while said insulating substrate is rotated and a principal surface of said insulating substrate is inclined with respect to a target plane.

13. The method as set forth in claim 8, further comprising a step of flattening the second part of said conductive layer.

14. The method as set forth in claim 8, wherein said lower electrodes are anodes and said upper electrodes are cathodes.

15. The method as set forth in claim 14, further comprising a step of forming a hole-transporting layer between said lower electrodes and said emitting layer.

16. The method as set forth in claim 14, further comprising a step of forming an electron-transporting layer between said emitting layer and said upper electrodes.

17. The method as set forth in claim 8, wherein said insulating substrate is transparent and said lower electrodes comprise transparent conductive layers.

18. The method as set forth in claim 17, wherein said transparent conductive layers comprise indium tin oxide.

19. The method as set forth in claim 8, wherein said first direction is approximately normal to said second direction.

* * * * *